United States Patent [19]
Lee

[11] Patent Number: 6,060,927
[45] Date of Patent: May 9, 2000

[54] HIGH-SPEED D FLIP-FLOP

[75] Inventor: Don-Woo Lee, Kyongsangbuk-do, Rep. of Korea

[73] Assignee: LG Semicon Co., Ltd., Cheongju, Rep. of Korea

[21] Appl. No.: 09/119,971

[22] Filed: Jul. 21, 1998

[30] Foreign Application Priority Data

Nov. 19, 1997 [KR] Rep. of Korea ............ 97-60980

[51] Int. Cl.[7] .................................................. H03K 3/356
[52] U.S. Cl. ................... 327/218; 327/210; 327/211; 327/212
[58] Field of Search ........................... 327/200, 202, 327/203, 208, 209, 210, 211, 212, 218; 326/93, 95, 98

[56] References Cited

U.S. PATENT DOCUMENTS 4,057,741  11/1977  Piguet ........................... 327/211
5,592,114  1/1997  Wu et al. ...................... 327/208

OTHER PUBLICATIONS

"A True Single Phase Clock Dynamic CMOs Circuit Technique" by Ji-Ren et al., IEEE Journal of Solid State Circuit vol. SC 22. No. 5, Oct., 1987, pp. 899–901.

"A Robust Single Phase Clocking for Low Power, High-Speed VLSI Applications" by Afghahi, IEEE Journal of Solid State Circuit, vol. 31, No. 2, Feb. 1996, pp. 247–253.

"High-Speed CMOS Circuit Technology" IEEE Journal of Solid-State Circuits, vol. 24, No. 1, Feb. 1989, pp. 62–63.

*Primary Examiner*—Tuan T. Lam
*Attorney, Agent, or Firm*—Fleshner & Kim, LLP

[57] ABSTRACT

A high-speed flip-flop is provided that implements a low power consumption and a high-speed response caused by an interior capacitance reduction. A D flip-flop includes a first latch that receives a clock signal and a data signal to produce a first output signal. A second latch receives the first output signal and the clock signal to produce a second output signal. A third latch receives the second output signal and the clock signal to produce a third output signal. An inverter receives the third output signal to produce the data signal on a rising or falling edge of the clock signal. The first and second latches are preferably ratioed latches having series coupled pull-up and pull-down elements. The third latch is preferably a clock operated latch.

20 Claims, 16 Drawing Sheets

| Q1' | CLK | Q1" |
|---|---|---|
| L | L | H |
| L | H | HOLD |
| H | L | H |
| H | H | L |

(TABLE 2)

| Q1" | CLK | /Q1 | Q1 |
|---|---|---|---|
| L | L | H | L |
| L | H | H | L |
| H | L | HOLD | HOLD |
| H | H | L | H |

(TABLE 2)

| D | CLK | Q2' |
|---|-----|-----|
| L | L   | H   |
| L | H   | L   |
| H | L   | HOLD |
| H | H   | L   |

(TABLE 4)

| Q2' | CLK | Q2" |
|---|---|---|
| L | L | H |
| L | H | L |
| H | L | HOLD |
| H | H | L |

(TABLE 5)

| Q2" | CLK | /Q2 | Q2 |
|---|---|---|---|
| L | L | H | L |
| L | H | HOLD | HOLD |
| H | L | L | H |
| H | H | L | H |

(TABLE 6)

HIGH-SPEED D FLIP-FLOP

BACKGROUND OF THE INVENTION

1. Field of the Invention

The present invention relates to flip-flops, and more particularly, to a D flip-flop.

2. Background of the Related Art

D flip-flops are a type of registers used in many semiconductor circuits. D flip-flops can be classified into rising edge D flip-flops where a data output is produced at a rising edge of a clock signal and falling edge D flip-flops where the data output is produced at a falling edge of the clock signal.

Input/output operations of a D flip-flop are accomplished during a cycle of the clock signal. In particular, during one half cycle of the clock signal, data is input and there is no output, and during the other half cycle of the clock signal, data is output and there is no input. FIG. 1 depicts symbols for a prior art D flip-flop circuit.

FIG. 2 depicts elements of the related art D flip-flop shown in FIG. 1. The D flip-flop of FIG. 1 has two latches such as a master latch and a slave latch. The master latch receives a clock signal CLK and a data signal D and produces an interior output signal Q'. The slave latch receives the output signal Q' of the master latch, stored in the master latch at a rising edge of the clock signal CLK, and produces an output signal Q having a logical value equal to that of the data D and a complementary signal /Q.

A detailed description of the master latch and the slave latch will now be provided. The data signal D is transmitted to an inverter 2 through a transmission gate 1. An output signal of the inverter 2 is the output signal Q' of the master latch. The output signal Q' is fed back into an input stage of the inverter 2 through an inverter 5 and a transmission gate 4. Thus, the inverter 2 has two input paths respectively controlled by the transmission gates 1 and 4. The transmission gate 1 controls a direct input path of the data signal D and the transmission gate 4 controls a feedback path. The two transmission gates 1 and 4 are controlled by the clock signal CLK. When the clock signal CLK is low level, the transmission gate 1 is turned on, and when the clock signal CLK is high level, the transmission gate 4 is turned on.

On/off operations of the two transmission gates 1 and 4, which are alternatively turned on (or alternatively turned off), determine a data output mode and a data hold mode of the master latch. If the transmission gate 1 is turned on, the output Q' is produced and the feedback path is not established. If the transmission gate 4 is turned on, the two inverters 2 and 5 and transmission gate 4 form a closed loop to continuously maintain the logical value of the output signal Q'.

The slave latch includes transmission gate 6, which receives the output signal Q' of the master latch, and the inverter 7 connected in series. An output signal of the inverter 7 is the output signal Q of the slave latch. The output signal Q is fed back into an input stage of the inverter 7 through an inverter 9 and a transmission gate 8. Thus, the inverter 7 has two input paths each respectively controlled by the two transmission gates 6 and 8. The transmission gate 6 controls a direct input path of the output signal Q', and the transmission gate 8 controls a feedback path. The two transmission gates 6 and 8 are controlled by the clock signal CLK. The transmission gate 6 is turned on when the clock signal CLK is high level and the transmission gate 8 is turned on when the clock signal CLK is low level.

On/off operations of the two transmission gates 6 and 8, which are alternatively turned on (or alternatively turned off), determines a data output mode and a data hold mode of the slave latch. When the transmission gate 6 is turned on, the inverter 7 produces the output signal Q and the feedback path is not established. When the transmission gate 8 is turned on, the two inverters 7 and 9 and the transmission gate 8 form a closed loop and the logical value of the output signal Q is continuously maintained. At this time, the output signal from the other inverter 9 is an inverted signal /Q of the output signal Q.

Accordingly, the data output operation and the data hold operation in the master latch and the slave latch are complementary. When the clock signal CLK goes to a low level, the transmission gate 1 of the master latch is turned on to input a data signal D to the master latch. But the transmission gate 6 of the slave latch 6 is turned off so that the newly input data signal D is not output. When the clock signal CLK goes to a high level, the transmission gate 1 of the master latch is turned off so that a new data signal D is not input to the master latch, but the logical value of the previously input data signal D is maintained. The transmission gate 6 of the slave latch is turned on to provide an inverted signal of the output signal Q' of the master latch (i.e., an inverted signal of the previously input data signal D) through the inverter 7 of the slave latch. Thus, an output signal Q having the same logical value of the input data D is produced by the slave latch.

As described above, the related art at D flip-flop has various disadvantages. To constitute the related art D flip-flop, a number of the transmission gates and inverters are required. The D flip-flop shown in FIG. 2 includes five inverters and four transmission gates. Implementing a number of logical gates with MOS transistors can increase an interior capacitance such as parasitic capacitance. An increase of the interior capacitance increases power consumption, and decreases an operating speed because of the number of elements.

The above references are incorporated by reference herein where appropriate for appropriate teachings of additional or alternative details, features and/or technical background.

SUMMARY OF THE INVENTION

An object of the present invention is to provide a flip-flop that substantially obviates one of the problems and disadvantages caused by limitations of the related art.

Another object of the present invention is to provide a rising edge operated D flip-flop and a falling edge operated D flip-flop having a reduced number of elements.

Another object of the present invention is to provide a flip-flop that implements a high-speed operation.

Another object of the present invention is to provide a flip-flop that implements low power consumption.

In order to achieve at least these and other objects in a whole or in parts, a high-speed D flip-flop according to an embodiment of the present invention includes a first latch for receiving a clock signal and a first data signal, producing a first output signal that is an inverted logical value of the input data signal in a low level period of the clock signal, producing the first output signal having a low level if the first data signal is in a high level depending on a logical value of the first data signal in a high level period of the clock signal, and maintaining a previous output value if the first data signal is in the low level; a second latch for receiving the first data signal as a second data signal, producing a second output signal having the high level in the low level period of the clock signal, producing a second output signal having the low level if the second data signal is in the high level depending on a logical value of the second data signal in the high level period of the clock signal, and maintaining a previous output value if the second data signal is in the low level; a third latch for receiving the second output signal as a third data signal, producing a third output signal that is an inverted logical value of the third data signal in the high level period of the clock signal, producing the third output signal having the low level if the third data signal is in the low level depending on the logical value of the third data signal in the low level period of the clock signal, and maintaining a previous output logical value if the third data signal is in the high level; and an inverter for inverting and then producing the third output signal.

To further achieve the above objects in a whole or in parts, a storage device is provided according to the present invention that includes a first latch that receives a clock signal and a data signal and produces a first output signal, wherein the first output signal is an inverted logical value of the clock signal when the data signal is low level, and wherein the first output signal is based on the clock signal when the data signal is high level; a second latch that receives the first output signal and the clock signal and produces a second output signal, wherein the second output signal is an inverted level of the clock signal when the first output signal is low level, wherein the second output signal is based on the clock signal when the first output signal is high level and a third latch that receives the second output signal and the clock signal and produces a third output signal, wherein the third output signal is a high level when the second output signal is low level, and wherein the third output signal is based on the clock signal when the second output signal is low level.

To further achieve the above objects in a whole or in parts, a storage device is provided according to the present invention that includes a three stage unit, wherein each stage receives a clock signal and an output signal from a preceding stage, wherein a first stage receives a data signal in a first half cycle of the clock signal and a third stage outputs the data signal in a second half cycle of the clock signal, and wherein the first and second stages are ratioed latches composed of a pull-up and a pull down transistor.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
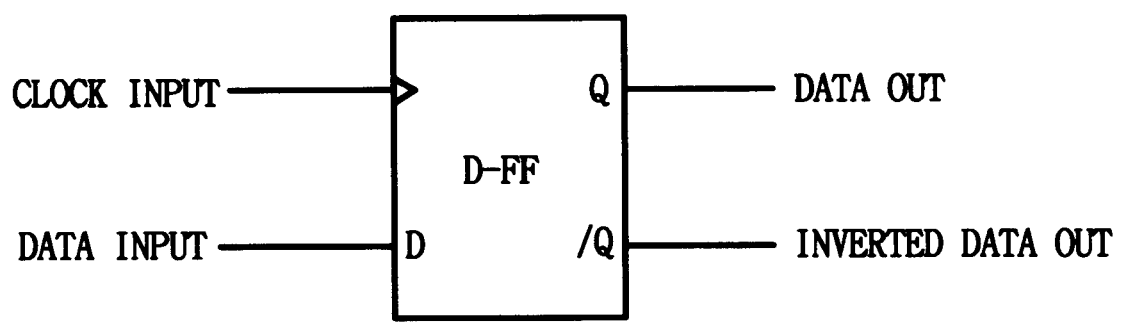
FIG. 1 is a diagram that shows a D flip-flop symbol.
Figure 2:
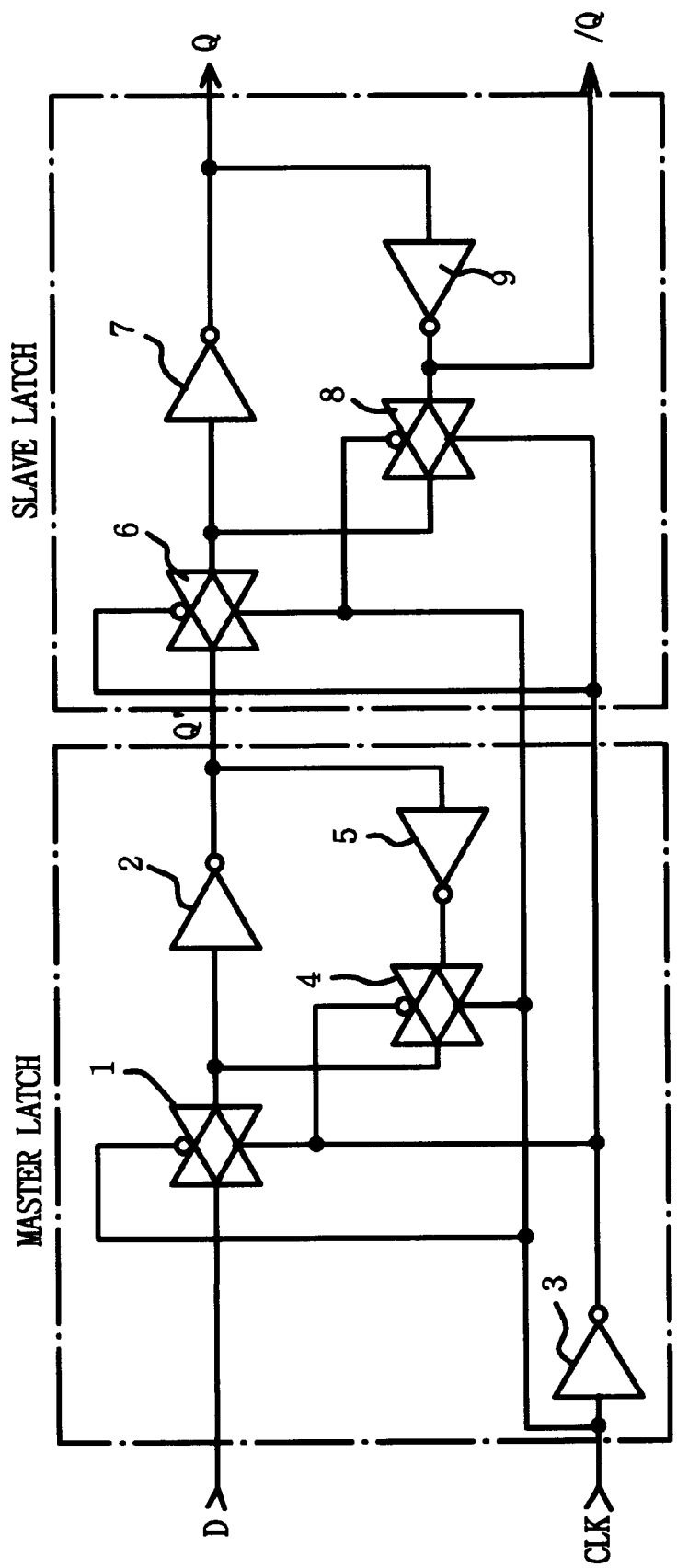
FIG. 2 is a diagram that shows a circuit of a prior art D flip-flop having two latches.
Figure 3:
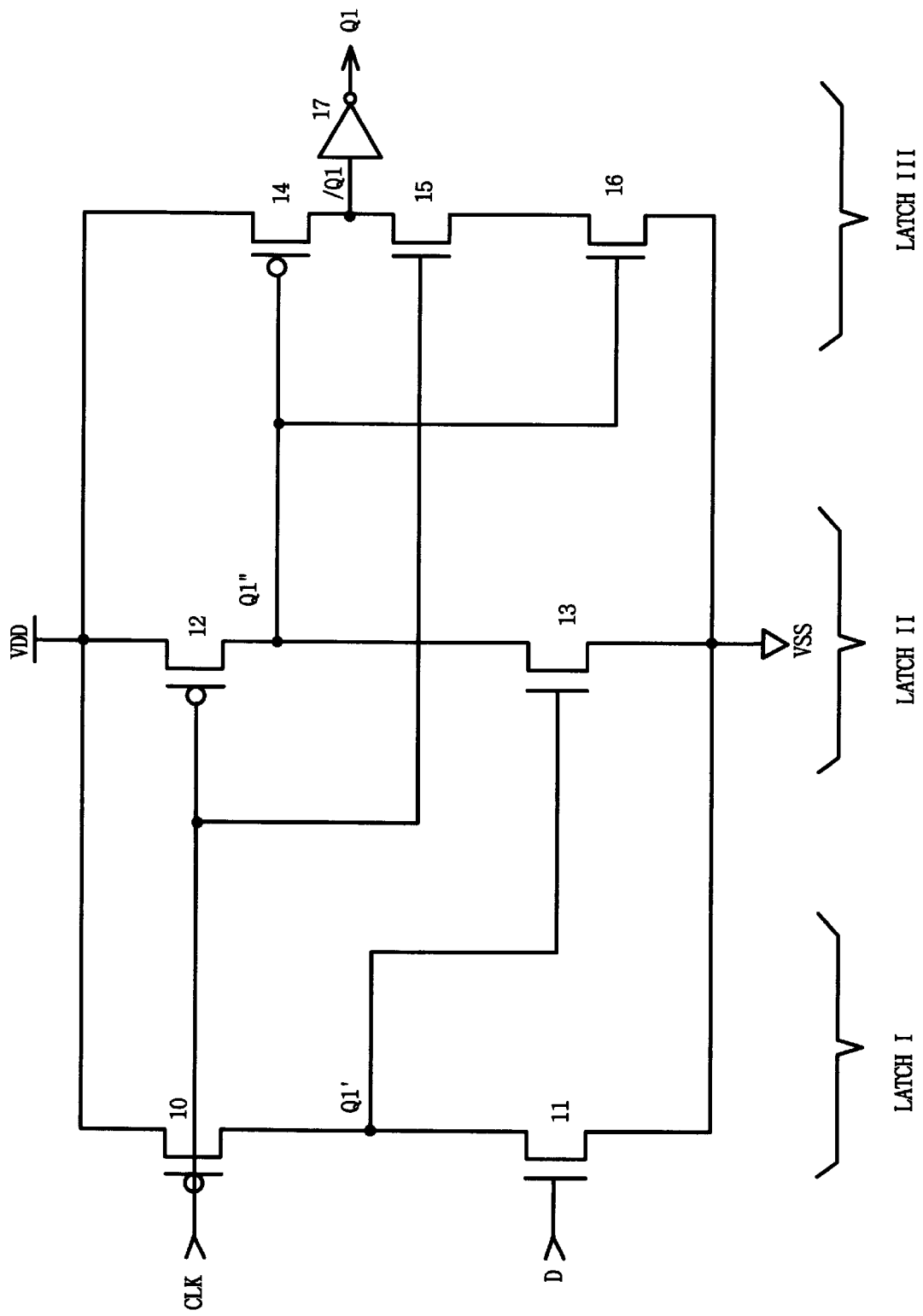
FIG. 3 is a diagram that shows a circuit of a preferred embodiment of a D flip-flop according to the present invention.

FIG. 3 is a diagram that shows a first preferred embodiment of a D flip-flop according to the present invention. The first preferred embodiment is a rising edge D flip-flop that includes latches I–III.

As shown in FIG. 3, the latch I preferably includes a PMOS transistor 10, which is a pull-up element controlled by a clock signal CLK, and a NMOS transistor 11, which is a pull-down element controlled by a data signal D, that are coupled in series between a supply voltage terminal VDD and a ground VSS. At an output stage where each drain of the PMOS transistor 10 and the NMOS transistor 11 is respectively interconnected, an output signal Q'1 is produced.

The latch II preferably includes a PMOS transistor 12, which is a pull-up element controlled by the clock signal CLK, and a NMOS transistor 13, which is a pull-down element controlled by the output signal Q1' of the latch I, that are coupled in series between the supply voltage VDD and the ground VSS. At an output stage where each drain of the PMOS transistor 12 and the NMOS transistor 13 is respectively interconnected, an output signal Q1" is produced.

The latches I and II are preferably ratioed latches. Magnitudes of the driving capability of the pull-up element and the driving capability of the pull-down element are different. For the latch I, the pull-down element driving capability is relatively larger. Accordingly, when the clock signal CLK is in the low level and the data signal D is in the high level, the output signal Q1' goes to the low level by the operation of the pull-down element 11 which has a relatively higher driving capability, even though both of the pull-up element 10 and the pull-down element 11 are enabled. However, for the latch II, the pull-up element 12 is relatively larger. Accordingly, when the clock signal CLK is in the low level and the output signal Q1' of the latch I is in the high level, the output signal Q1" goes to the high level by the operation of the pull-up element 12, which has relatively higher driving capability, even though both the pull-up element 12 and the pull-down element 13 are turned on. In addition, the latch II is a precharged latch and an initial value of the latch is always in the high level.

The latch III is preferably a clocked CMOS latch. A PMOS transistor 14, which is a pull-up element, and an NMOS transistor 16, which is a pull-down element, are coupled in series between the supply voltage terminal VDD and the ground VSS. Both of the PMOS transistor 14 directly coupled to the supply voltage terminal VDD and NMOS transistor 16 directly coupled to the ground VSS are controlled by the output signal Q1" of the latch II. However, a NMOS transistor 15 controlled by the clock signal CLK is coupled between the PMOS transistor 14 and the NMOS transistor 16. An output stage of the latch III is where drains of the PMOS transistor 14 and the NMOS transistor 15 are respectively interconnected. Accordingly, the low level signal is produced depending on the ground signal VSS only when the clock signal CLK goes to the high level to turn on the NMOS transistor 15 even though the NMOS transistor 16, which is the pull-down element, is turned on. The output stage where the drains of the NMOS transistor 15 and PMOS transistor 14 are interconnected produces the output signal /Q1. The output signal /Q1 is inverted by an inverter 17 to produce the output signal Q1.

Figure 4:
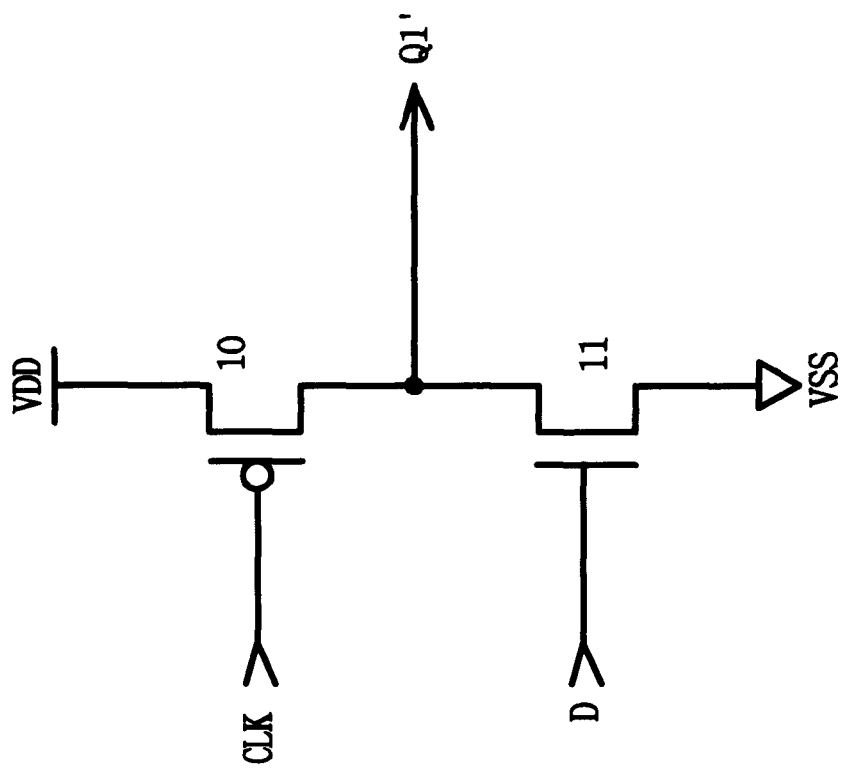
FIGS. 4–6 are diagrams that show latches of the circuit of FIG. 3.
Figure 5:
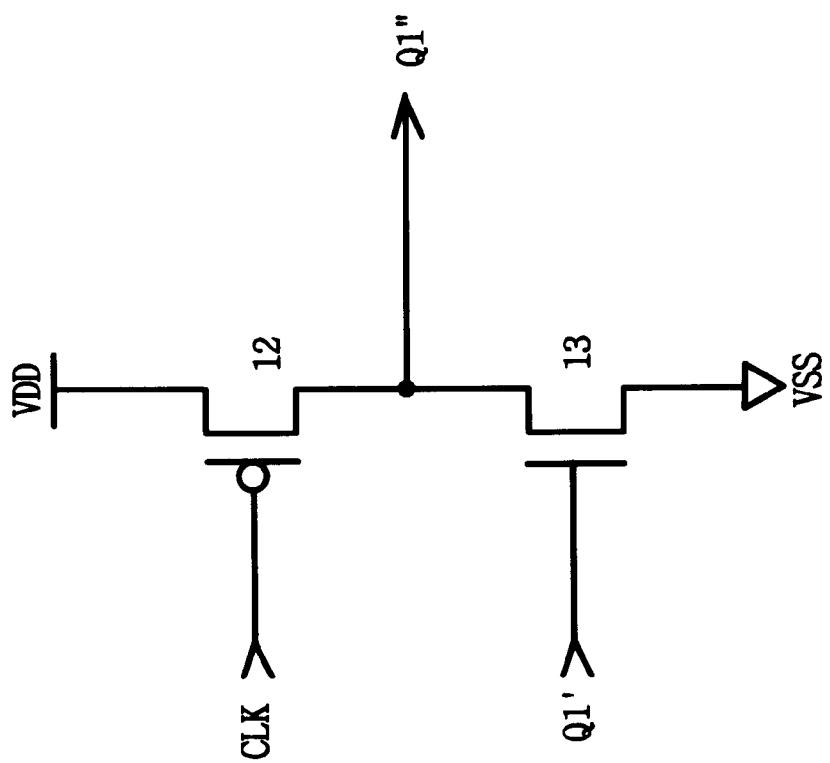
Figure 6:
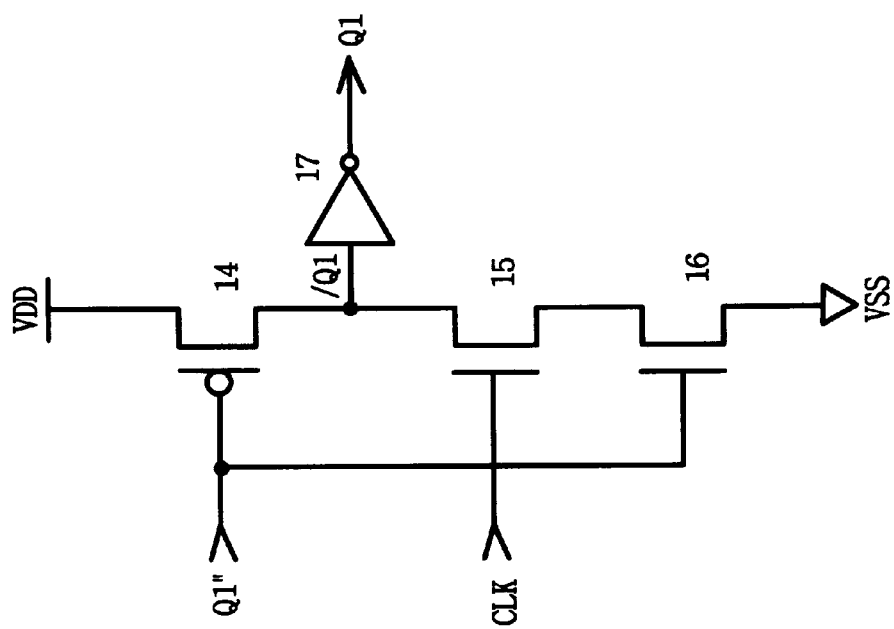

FIGS. 4 to 6 respectively show latches I–III of the first preferred embodiment of rising edge operated D flip-flops according to the present invention. As shown in FIG. 4, table 1 represents the operational characteristics of the latch I. As shown in the table 1, if both of the data signal D and the clock signal CLK are in the low level, the PMOS transistor 10 is turned on and the output signal Q1' goes to the high level. If both of the data signal D and the clock signal CLK are in the high level, the NMOS transistor 11 is turned on and the output signal Q1' goes to the low level. If the data signal D is in the low level and the clock signal CLK is in the high level, both of the transistors 10 and 11 are turned off, and the previous output value is maintained. If the data D is in the high level and the clock signal CLK is in the low level, both of the transistors 10 and 11 are turned on, but the output signal Q1' goes to the low level since the driving capability of the NMOS transistor 11 is relatively higher than that of the PMOS transistor 10.

As shown in FIG. 5, table 2 represents operational characteristics of the latch II. As shown in the table 2, if both of the output signal Q1' of the latch I and the clock signal CLK are in the low level, the PMOS transistor 12 is turned on, and the output signal Q1" goes to the high level. If both of the output signal Q1' and the clock signal CLK are in the high level, the NMOS transistor 13 is turned on, and the output signal Q1" goes to the low level. If the output signal Q'1 of the latch I is in the low level and the clock signal CLK is in the high level, both of the transistors 12 and 13 are turned off, and the previous output value is maintained. If the output signal Q1' is in the high level and the clock signal CLK is in the low level, both of the transistors 12 and 13 are turned on, but the output signal Q1" goes to the high level since the driving capability of the PMOS transistor 12 is relatively higher than that of the NMOS transistor 13.

As shown in FIG. 6, table 3 represents operational characteristics of the latch III. As represented in the table 3, if both of the output signal Q1" of the latch II and the clock signal CLK are in the low level, only the PMOS transistor 14 is turned on, and the output signal /Q1 goes to the high level. If both of the output signal Q1" and the clock signal CLK are in the high level, both of the NMOS transistors 15 and 16 are turned on and the output signal /Q1 goes to the low level. If the output signal Q1" is in the low level and the clock signal CLK is in the high level, the PMOS transistor 14 is turned on, and the output signal /Q1 goes to the high level. If the output signal Q1" is in the high level and the clock signal CLK is in the low level, the output signal /Q1 is not changed and the previous logical value is maintained because both of the PMOS transistor 14 and the NMOS transistor 15 directly coupled to the output stage are turned off.

Operations of the first preferred embodiment of the rising edge D flip-flop that depend on changes of a clock signal will now be described. The operation will be described in reference to FIGS. 4–6.

In an initial state, when the NMOS transistor 11 of the latch I is turned off by the low level data signal D and the PMOS transistor 10 is turned on by the low level clock signal CLK, the output signal Q1' of the latch I goes to the high level. The high level output signal Q1' causes the NMOS transistor 13 of the latch II to be turned on. At this time, the output signal Q1" has a high level initial value even though the PMOS transistor 12 is also turned on.

The high level output signal Q1" and the low level clock signal CLK cannot turn on the transistors 14 and 15 of the latch III. Thus, the output signal /Q1 of the latch III maintains the previous state logical value.

In the initial state, if the high data signal D is applied to the NMOS transistor 11 of the latch I, the NMOS transistor 11 is turned on. The PMOS transistor 10 of the latch I is also turned on by the low level clock signal CKL, but the output signal Q1' goes to the low level since the driving capability of the NMOS transistor 11 is relatively higher than that of the PMOS transistor 10. Since the NMOS transistor 13 of the latch II is thus turned off and the PMOS transistor 12 was previously turned on by the low level clock signal CLK, the output signal Q1" continues to maintain the high level. Thus, the logical value of the output signal Q1" of the latch II and the clock signal CLK are unchanged from the initial state. Accordingly, the output signal /Q1 from the latch III continues to maintain the previous state logical value.

Then, if the clock signal CLK transits to the high level, the PMOS transistor 10 of the latch I is turned off, and a logical value of the output signal Q1' from the latch I continues to maintain the low level. The PMOS transistor 12 of the latch II is turned off by the high level clock signal CLK. Thus, both of the PMOS transistor 12 and the NMOS transistor 13 of the latch II are turned off, and the previous state logical value of the output signal Q1", which was high level, is maintained. Since the NMOS transistor 15 of the latch III is turned on by the high level clock signal CLK and the NMOS transistor 16 is turned on by the high level output signal Q1" of the latch II, the output signal /Q1 goes to the low level. Thus, the output signal Q1 of the inverter 17 goes to the high level. In summary, when the clock signal CLK transits from the low level to the high level, the high level data signal D, which is a previous step input signal, is output.

When the logical value of the data signal D is in the high level, if the clock signal CLK transits back to the low level, the PMOS transistor 10 of the latch I is turned on. However, the output signal Q1' of the latch I continues to maintain the low level since the NMOS transistor 11 was already turned on. The low level output signal Q1' turns off the NMOS transistor 13 of the latch II, and the low level clock signal CLK turns on the PMOS transistor 12. Thus, the output signal Q1" of the latch II maintains the high level. The high level output signal Q1" of the latch II turns off the PMOS transistor 14 of the latch III and turns on the NMOS transistor 16 coupled to the ground terminal VSS. However, the NMOS transistor 15 coupled to the output stage is turned off by the low level clock signal CLK to continuously maintain the low level output signal /Q1, which was the logical value of the previous state.

In summary, when the clock signal CLK transits from the high level to the low level, the output signal Q1 is not changed. Thus, in this case, the previous state high level logical value is maintained.

When the clock signal CLK is in the low level, if the data signal D is changed to the low level, the NMOS transistor 11 of the latch I is turned off by the low level data signal D, and the PMOS transistor 10 is turned on by the clock signal CLK. Thus, the output signal Q1' goes to the high level. Both the PMOS transistor 12 and the NMOS transistor 13 of the latch II are turned on by the low level clock signal CLK and the high level output signal Q1' from the latch I. Thus, the output signal Q1" from the latch II goes to the high level because of the relatively higher driving capability of the PMOS transistor 12. The high level output signal Q1" turns off the PMOS transistor 14 of the latch III and turns on the NMOS transistor 16. However, the output signal /Q1 continues to maintain the low level, which is the previous logical value, since the NMOS transistor 15 was already turned off by the low level clock signal CLK. Since the clock signal CLK already transited from the low level to the high level (i.e., a rising edge), the final output signal Q1 maintains the high level logical value although the low level data signal D was applied.

When the data signal D is in the low level, if the clock signal CLK transits to the high level, both of the PMOS transistor 10 and the NMOS transistor 11 of the latch I are turned off. Thus, the output signal Q1' of the latch I maintains the high level, which is the previous state logical value. Since the PMOS transistor 12 is turned off by the clock signal CLK transited to the high level and the NMOS transistor 13 was already turned on by the high level output signal Q1' of the latch I, the output signal Q1" goes to the low level. The low level output signal Q1" turns on the PMOS transistor 14 of the latch III and turns off the NMOS transistor 16 of the latch III. Thus, the output signal /Q1 goes to the high level, and a logical value of the output signal Q1 of the inverter 17 goes to the low level. In summary, the low level data signal D, which was received in the previous step, is output when the clock signal CLK transits to the high level.

If the clock signal CLK transits back to the low level, only the PMOS transistor 10 of the latch I is turned on. Thus, the output signal Q1' is maintained at the high level. The high level output signal Q1' turns on the NMOS transistor 13 of the latch II, but the output signal Q1' goes to the high level since the PMOS transistor 12 has a relatively higher driving capability. The high level output signal Q1" turns off the PMOS transistor 14 and turns on the NMOS transistor 16. However, the output signal /Q1 of the latch III maintains the high level, which is the previous state logical value, since the NMOS transistor 15 is turned off by the low level clock signal CLK. The output signal Q1 from the inverter 17 continues to maintain the low level logical value since the clock signal CLK input transits to the low level. In other words, the rising edge of the clock CLK is not produced.

Figure 7A:
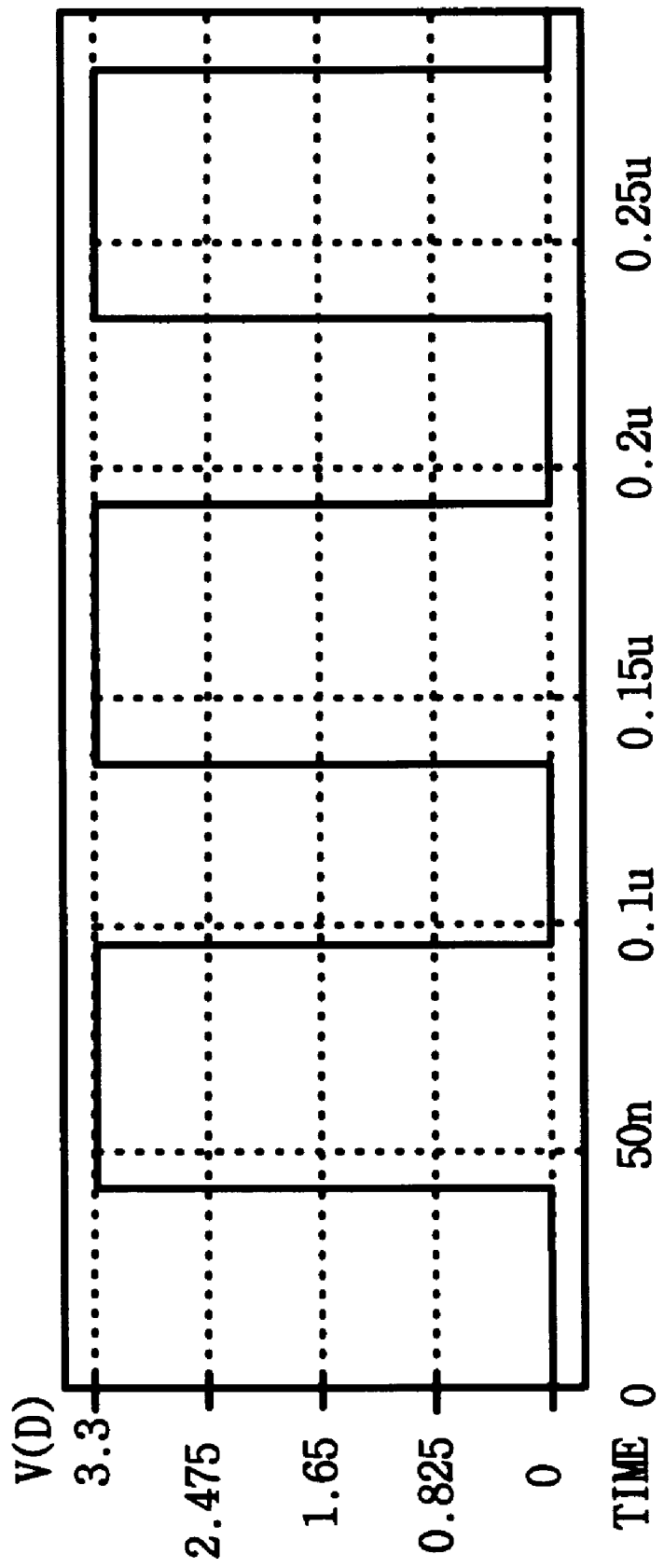
FIGS. 7A–7C are diagrams that show simulated operations of the circuit of FIG. 3.
Figure 7B:
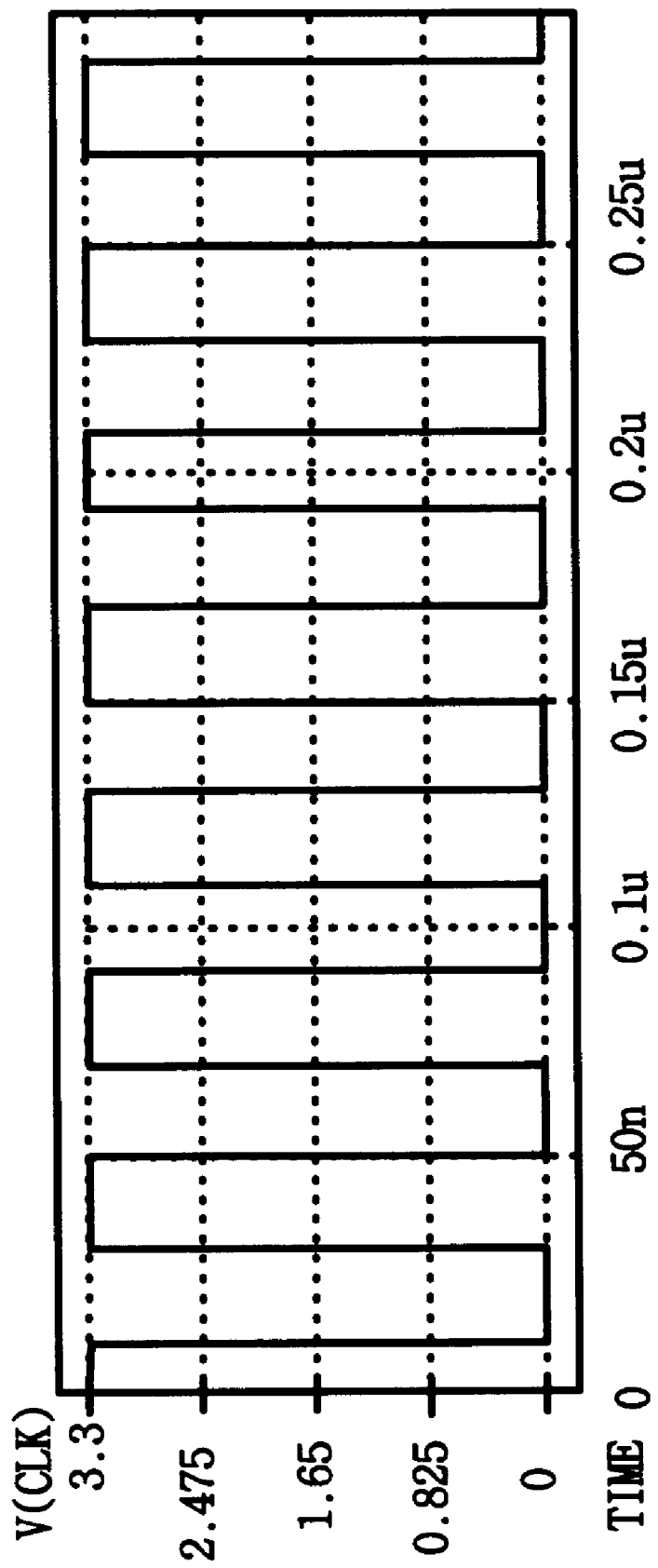
Figure 7C:
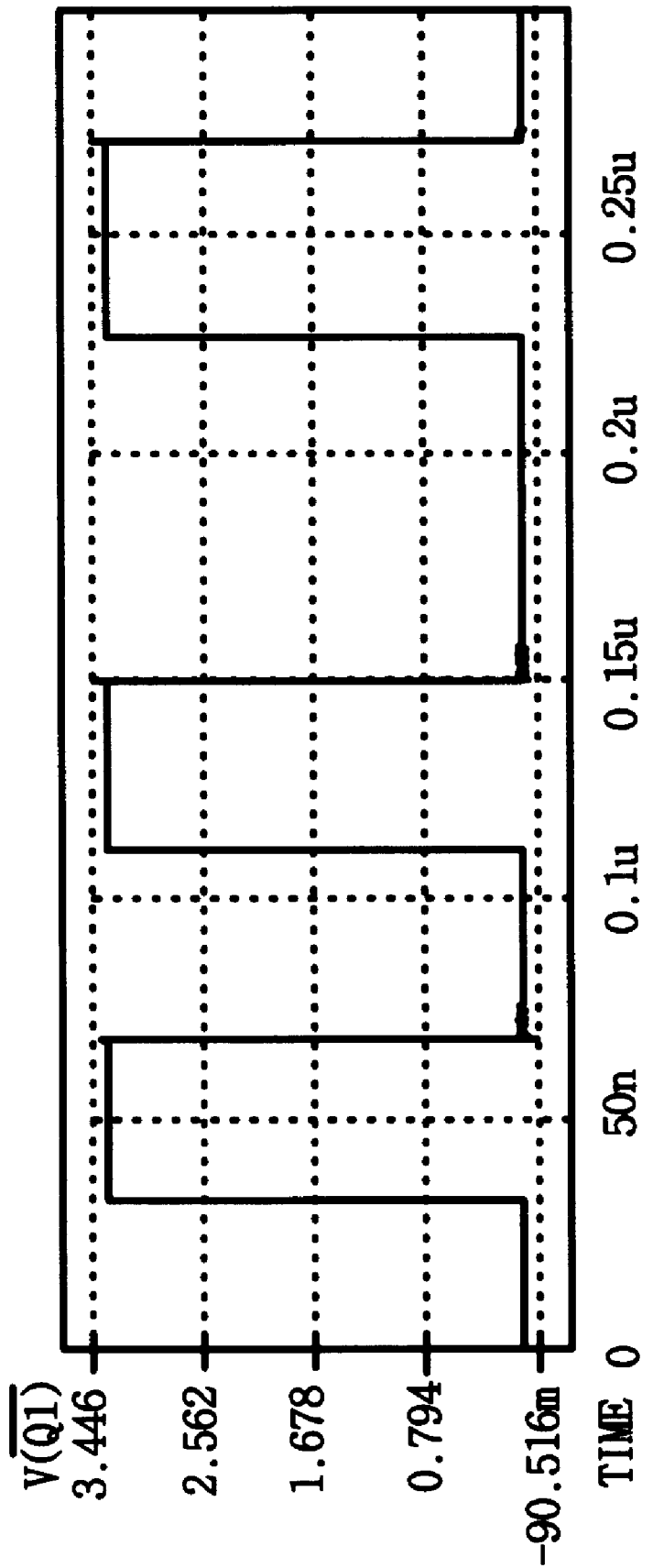

Simulation (i.e., HSPICE) results of the first preferred embodiment of the rising edge operated D flip-flop according to the present invention are shown in FIGS. 7A–7C. As shown in FIGS. 7A–7C, a logical value of the input data is maintained at the falling edge of the clock signal CLK and a logical value of the data signal D, which was already input, is output at the rising edge.

Figure 8:
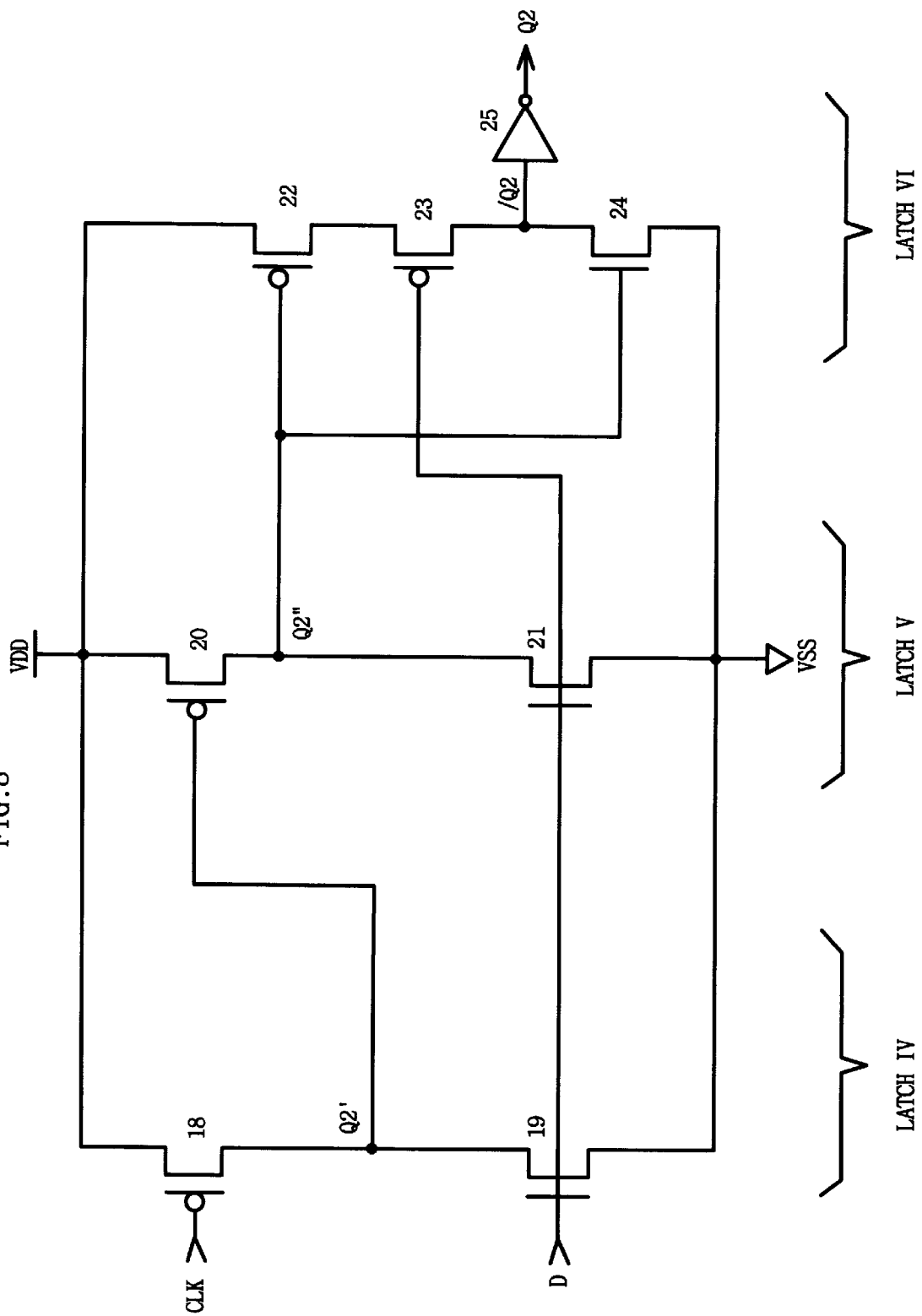
FIG. 8 is a diagram that shows a circuit of another preferred embodiment of a D flip-flop according to the present invention.

FIG. 8 is a diagram that shows a second preferred embodiment of a D flip-flop according to the present invention. The second preferred embodiment is a falling edge D flip-flop that includes latches IV—VI.

As shown in FIG. 8, the latch IV preferably includes a PMOS transistor 18, which is a pull-up element, controlled by the data signal D and a NMOS transistor 19, which is a pull-down element, controlled by the clock signal CLK that are coupled in series between the supply voltage terminal VDD and the ground VSS. An output stage where each drain of the PMOS transistor 18 and the NMOS transistor 19 is respectively interconnected provides an output signal Q2'.

The latch V preferably includes a PMOS transistor 20, which is a pull-up element, controlled by the output signal Q2' of the latch IV and a NMOS transistor 21, which is a pull-down element, controlled by the clock signal CLK that are coupled in series between the supply voltage terminal VDD and the ground VSS. An output stage where each drain of the PMOS transistor 20 and the NMOS transistor 21 is respectively interconnected produces an output signal Q2".

The latch IV and the latch V are preferably ratioed latches. The magnitudes of the driving capability of the pull-up element and the driving capability of the pull-down element are different. In the latches IV and V, the pull-down element driving capability is relatively higher. For the latch IV, if the clock signal CLK is in the high level and the data signal D is in the low level, both of the pull-up element 18 and the pull-down element 19 are enabled. The output signal Q2' goes to the low level by the operation of the pull-down element 19, which has a relatively higher driving capability than that of the pull-up element 18. For the latch V, if the clock signal CLK is in the high level and the output signal Q2' of the latch IV is in the low level, both of the pull-up element 20 and the pull-down element 21 are enabled. The output signal Q2" goes to the low level by the operation of the pull-down element 21, which has a relatively higher driving capability than that of the pull-up element 20. In addition, the latch V is a precharged latch and has a high level initial value.

The latch VI is preferably a clock operated CMOS latch. The latch VII preferably includes a PMOS transistor 22, which is a pull-up element, and a NMOS transistor 24, which is a pull-down element, that are coupled in series between the supply voltage terminal VDD and the ground VSS. The PMOS transistor 22 is directly coupled to the supply voltage terminal VDD, and the NMOS transistor 24 is directly coupled to the ground terminal VSS. The transistors 22 and 24 are controlled by the output signal Q2" of the latch V. A PMOS transistor 23 is controlled by the clock signal CLK. The PMOS transistor 23 is coupled between the PMOS transistor 22 and the NMOS transistor 24. An output stage of the latch VI is where drains of the PMOS transistor 23 and the NMOS transistor 24 are respectively interconnected. Accordingly, the high level output signal is produced by the supply voltage VDD only when the clock signal CLK goes to the low level to turn on the PMOS transistor 23 even though the PMOS transistor 22, which is the pull-up element, is turned on. The output stage where the drains of the PMOS transistor 23 and the NMOS transistor 24 are coupled together produces an output signal /Q2. The output signal /Q2 is inverted by an inverter 25 to produce an output signal Q2.

Figure 9:
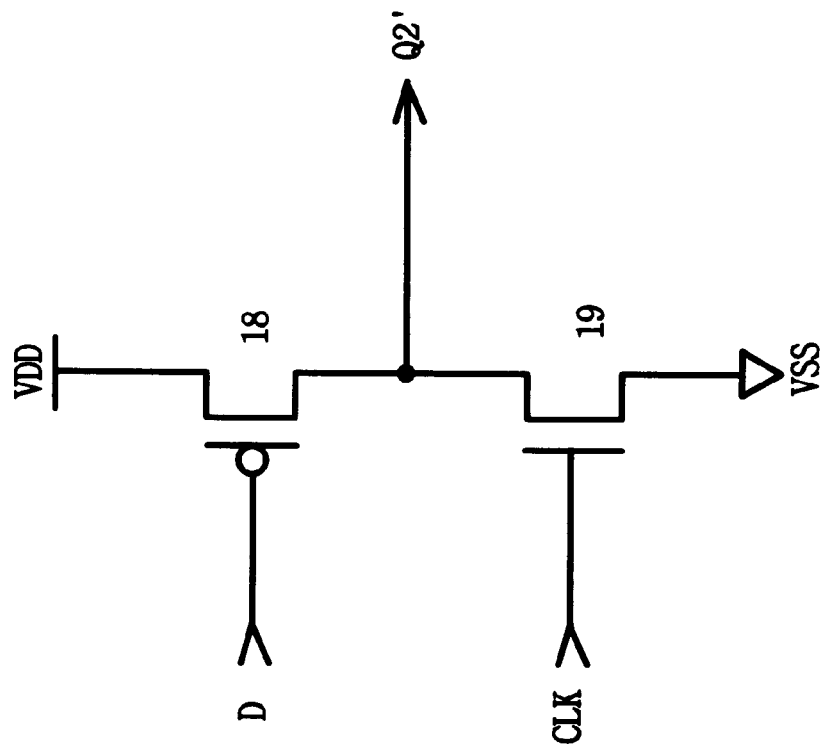
FIGS. 9–11 are diagrams that show latches of the circuit of FIG. 8.
Figure 10:
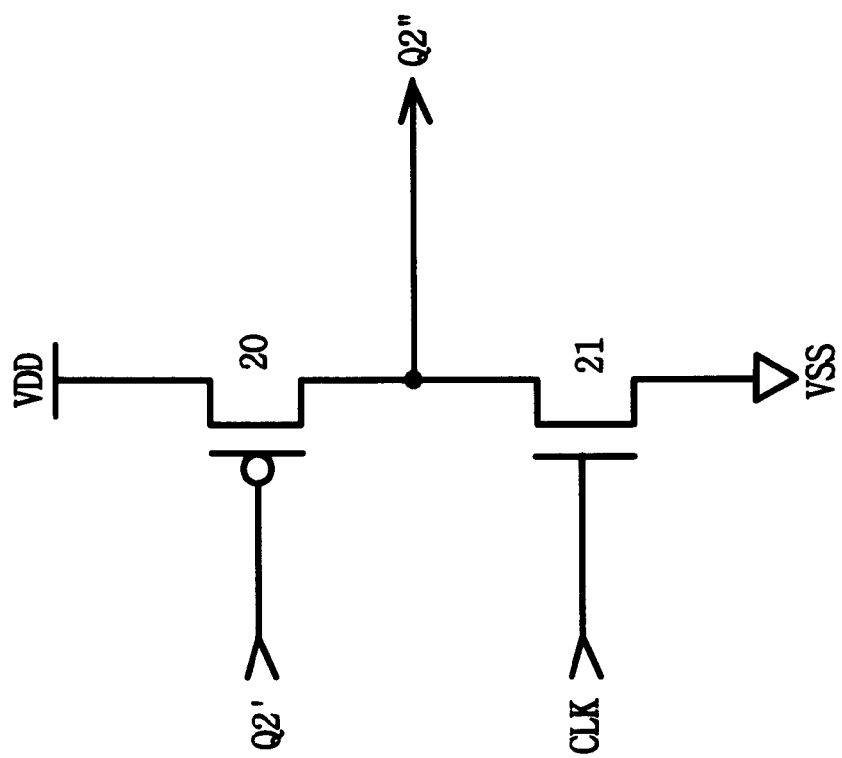
Figure 11:
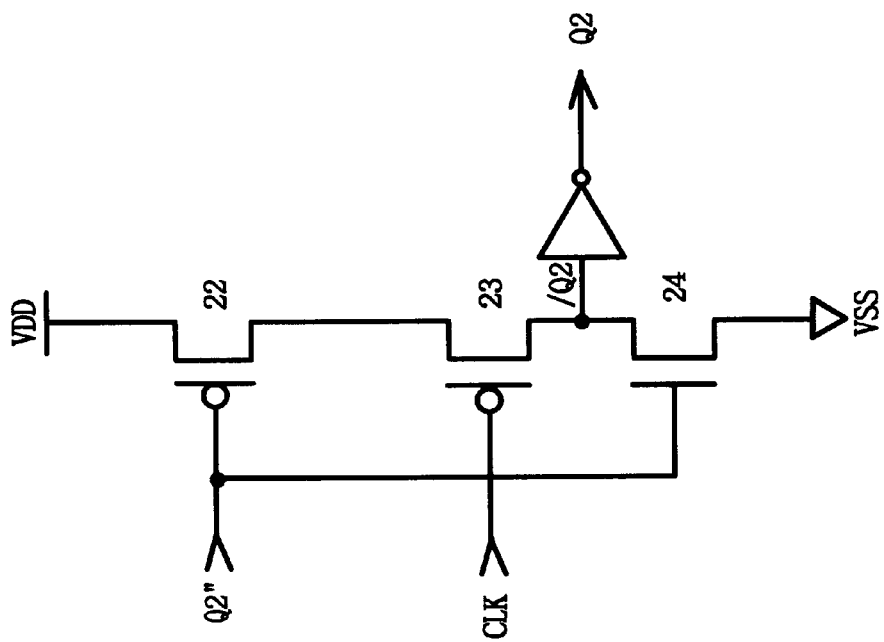

FIGS. 9 to 11 respectively show latches IV–VI of the second preferred embodiment of falling edge operated D flip-flops according to the present invention. As shown in FIG. 9, table 4 represents operational characteristics of the latch IV. As represented in the table 4, if both of the data signal D and the clock signal CLK are in the low level, the PMOS transistor 18 is turned on, and the output signal Q2' goes to the high level. If both of the data signal D and the clock signal CLK are in the high level, the NMOS transistor 19 is turned on, and the output signal Q2' goes to the low level. If the data signal D is in the high level and the clock signal CLK is in the low level, both of the transistors 18 and 19 are turned off to maintain a previous output value. If the data signal D is in the low level and the clock signal CLK is in the high level, both of the transistors 18 and 19 are turned on. However, the output signal Q2' goes to the low level since the driving capability of the NMOS transistor 19 is relatively higher than that of the PMOS transistor 18.

As shown in FIG. 10, table 5 represents operational characteristics of the latch V. As represented in the table 5, if both of the output signal Q2' from the latch IV and the clock signal CLK are in the low level, a PMOS transistor 20 is turned on and then the output signal Q2" goes to the high level. If both of the output signal Q2' from the latch IV and the clock signal CLK are in the high level, the NMOS transistor 21 is turned on and then the output signal Q2" goes to the low level. If the output signal Q2' from the latch IV is in the high level and the clock signal CLK is in the low level, both of the transistors 20 and 21 are turned off and the previous output value is maintained. If the output signal Q2' from the latch IV is in the low level and the clock signal CLK is in the high level, both of the transistors 20 and 21 are turned on but the output signal Q2" goes to the low level because of the relatively higher driving capability of the NMOS transistor 21.

As shown in FIG. 11, table 6 represents operational characteristics of the latch VI. As represented in the table 6, if both of the output signal Q2" from the latch V and the clock signal CLK are in the low level, two PMOS transistors 22 and 23 are turned on and then the output signal /Q2 goes to the high level. If both of the output signal Q2" from the latch V and the clock signal CLK are in the high level, only the NMOS transistor 24 is turned on and then the output signal /Q2 goes to the low level. If the output signal Q2" from the latch V is in the low level and the clock signal CLK is in the high level, the NMOS transistor 24 is turned off and the PMOS transistor 22 is turned on. However, the PMOS transistor 23 coupled to the output stage is turned off by the high level clock signal CLK and then the output signal Q2" maintains the previous state logical value. If the output signal Q2" from the latch V is in the high level and the clock signal CLK is in the low level, the PMOS transistor 22 is turned off and the NMOS transistor 24 is turned on and then the output signal /Q2 goes to the low level.

Operations of the second preferred embodiment of the falling edge D flip-flop that depend on changes of a clock signal will now be described. The operations will be described with reference to FIGS. 9–11.

When the low level data signal D is applied to the latch IV and the clock signal CLK is also in the low level, the output signal Q2' from the latch IV goes to the high level. Since the high level output signal Q2' turns off the PMOS transistor 20 of the latch V and the NMOS transistor 21 is also turned off by the low level clock signal CLK, the output signal Q2" from the latch V maintains the previous state. Thus, the output signal /Q2 from the latch V and the output signal Q2 from an inverter 25 are also unchanged.

In this state, if the high level data signal D is applied, the output signal Q2' from the latch IV maintains the previous state high level logical value because the PMOS transistor 18 of the latch IV is turned off and the NMOS transistor 19 was turned off. Thus, the output signal Q2" from the latch V and the output signal /Q2 from the latch VI are also unchanged.

When the high level data signal was applied to the latch IV and the clock signal CLK transits to the high level, the output signal Q2' from the latch IV goes to the low level logical value. Since the low level output signal Q2' turns on the PMOS transistor 20 of the latch V and the NMOS transistor 21 was turned on by the high level clock signal CLK, the output signal Q2" goes to the low level. The low level output signal Q2" turns off the NMOS transistor 24 of the latch IV and turns on the PMOS transistor 22. However, the output signal /Q2 is unchanged and maintains the previous state logical value since the PMOS transistor 23 is turned off by the high level clock signal CLK.

When the high level data signal D was applied to the latch IV and the clock signal CLK transits to the low level, both of the PMOS transistor 18 and the NMOS transistor 19 of the latch IV are turned off Then, the output signal Q2' maintains the low level, which is the previous state logical value. The low level output signal Q2' turns on the PMOS transistor 20 of the latch V, and the NMOS transistor 21 is turned off by the low level clock signal CLK. Thus, the output signal Q2" goes to the high level. The high level output signal Q2" turns off the PMOS transistor 22 of the latch VI and turns on the NMOS transistor 24 directly coupled to the ground terminal VSS. Thus, the output signal /Q2 goes to the low level and the output signal Q2 from the inverter 25 goes to the high level. The high level output signal Q2, which is the previous input data signal D, is produced by the clock signal CLK transition from the high level to the low level (i.e., a falling edge).

When the previous input data signal D is in the high level and the clock signal CLK transits back to the high level, the NMOS transistor 19 of the latch IV is turned on. Thus, the output signal Q2' goes to the low level. The low level output signal Q2' turns on the PMOS transistor 20 of the latch V. However, the output signal Q2" goes to the low level since the NMOS transistor 21 having a relatively higher driving capability is turned on by the high level clock signal CLK. The low level output signal Q2" turns off the NMOS transistor 24 of the latch VI and turns on the PMOS transistor 22. However, the PMOS transistor 23 is turned off by the high level clock signal CLK and then the output signal /Q2 maintains the low level, which is the previous state logical value.

When the clock signal CLK is in the high level and the low level data signal D is applied to the latch IV, both of the PMOS transistor 18 and the NMOS transistor 19 of the latch IV are enabled. However, the output signal Q2' goes to the low level because of the relatively higher driving capability of the NMOS transistor 19. The low level output signal Q2' turns on the PMOS transistor 20 of the latch V, but the output signal Q2" goes to the low level since the NMOS transistor 21 is turned on by the high level clock signal CLK. The low level output signal Q2" turns off the NMOS transistor 24 of the latch VI and turns on the PMOS transistor 22. However, the output signal /Q2 maintains the high level previous state because the PMOS transistor 23 is turned off by the high level clock signal CLK.

When the low level data signal D was applied to the latch IV and the clock signal CLK transits to the low level, the NMOS transistor 19 of the latch IV is turned off, and the PMOS transistor 18 is turned on. Thus, the output signal Q2' goes to the high level. The high level output signal Q2' turns off the PMOS transistor 20 of the latch V and the NMOS transistor 21 is also turned off by the low level clock signal CLK. Thus, the output signal Q2" maintains the low level, which is the previous state logical value. The low level output signal Q2" turns off the NMOS transistor 24 of the latch VI and turns on the PMOS transistor 22. Since the PMOS transistor 23 coupled to the output stage was also turned on by the low level clock signal CLK, the output signal /Q2 of the latch VI goes to the high level. The output signal Q2 from the inverter 25 goes to the low level. The low level output signal Q2 is the low level data signal D, which was input in the previous step, and is now produced by the clock signal CLK transiting from the high level to the low level (i.e., a falling edge).

When the previous input data signal D is in the low level and the clock signal CLK transits to the high level, both of the PMOS transistor 18 and the NMOS transistor 19 of the latch IV are enabled. However, the output signal Q2' goes to the low level since the driving capability of the NMOS transistor 19 is relatively higher than the PMOS transistor 18. The low level output signal Q2' turns on the PMOS transistor 20 of the latch V. However, the output signal Q2"

goes to the low level since the NMOS transistor 21 having a relatively higher driving capability is also turned on by the high level clock signal CLK. The low level output signal Q2" turns off the NMOS transistor 24 of the latch VI and turns on the PMOS transistor 22. However, the output signal /Q2 is continuously maintained the low level previous state logical value because the PMOS transistor 23 coupled to the output stage was turned off by the high level clock signal CLK.

Figure 12A:
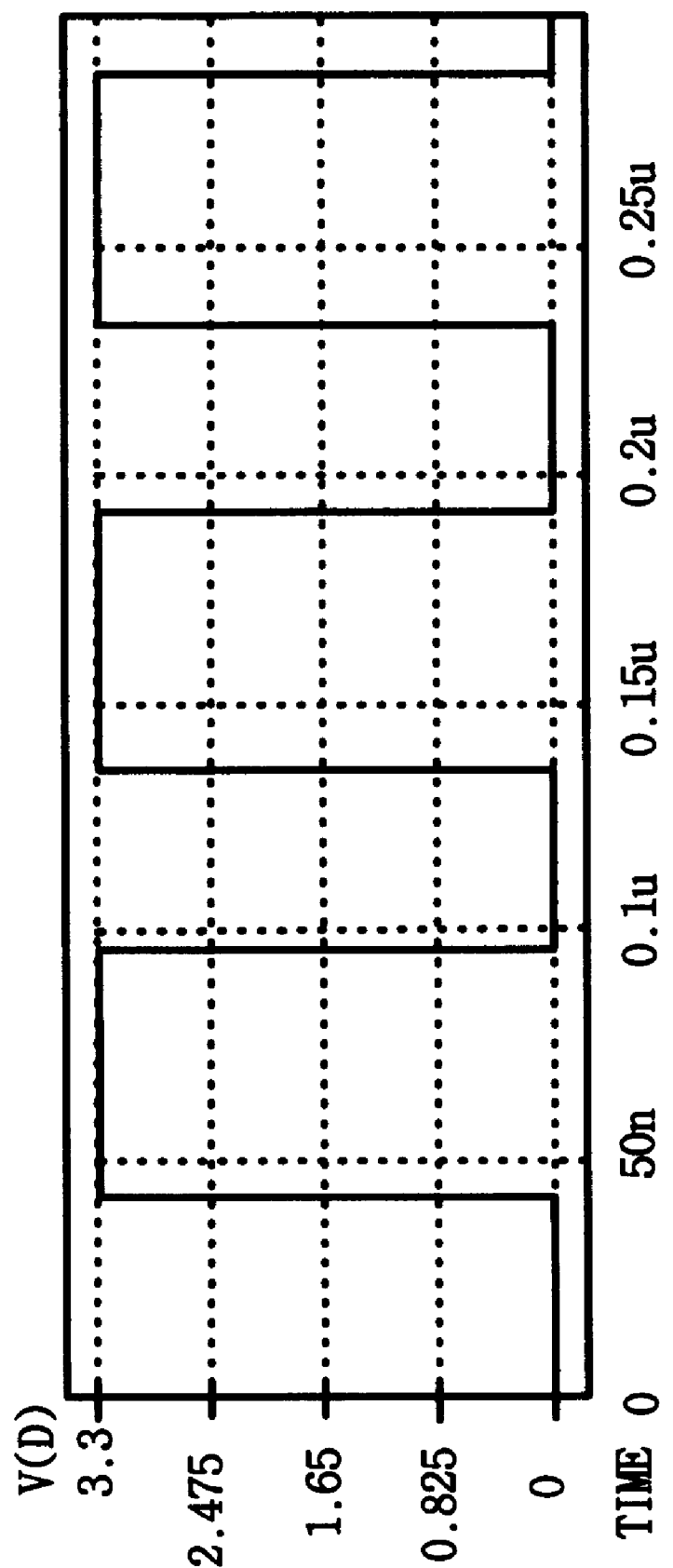
FIG. 12A–12C are diagrams that show simulated operations of the circuit of FIG. 8.
Figure 12B:
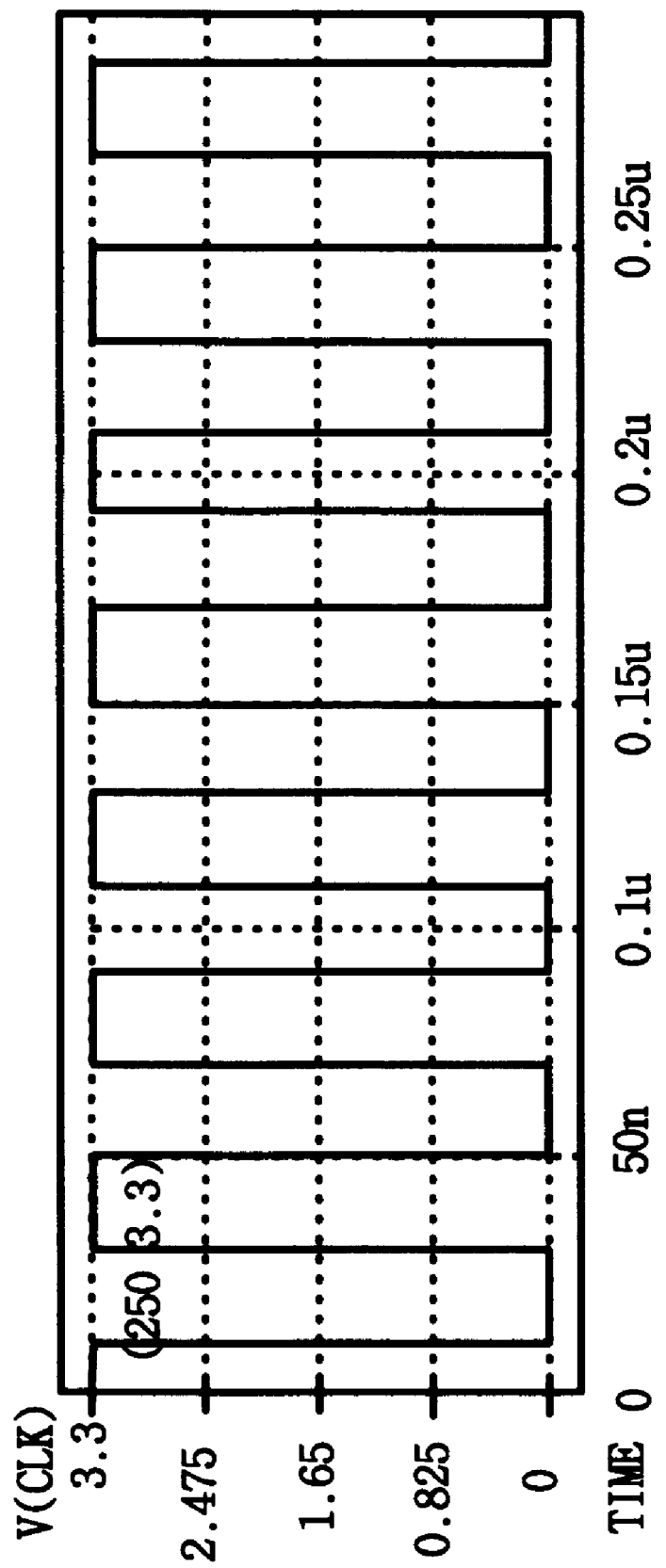
Figure 12C:
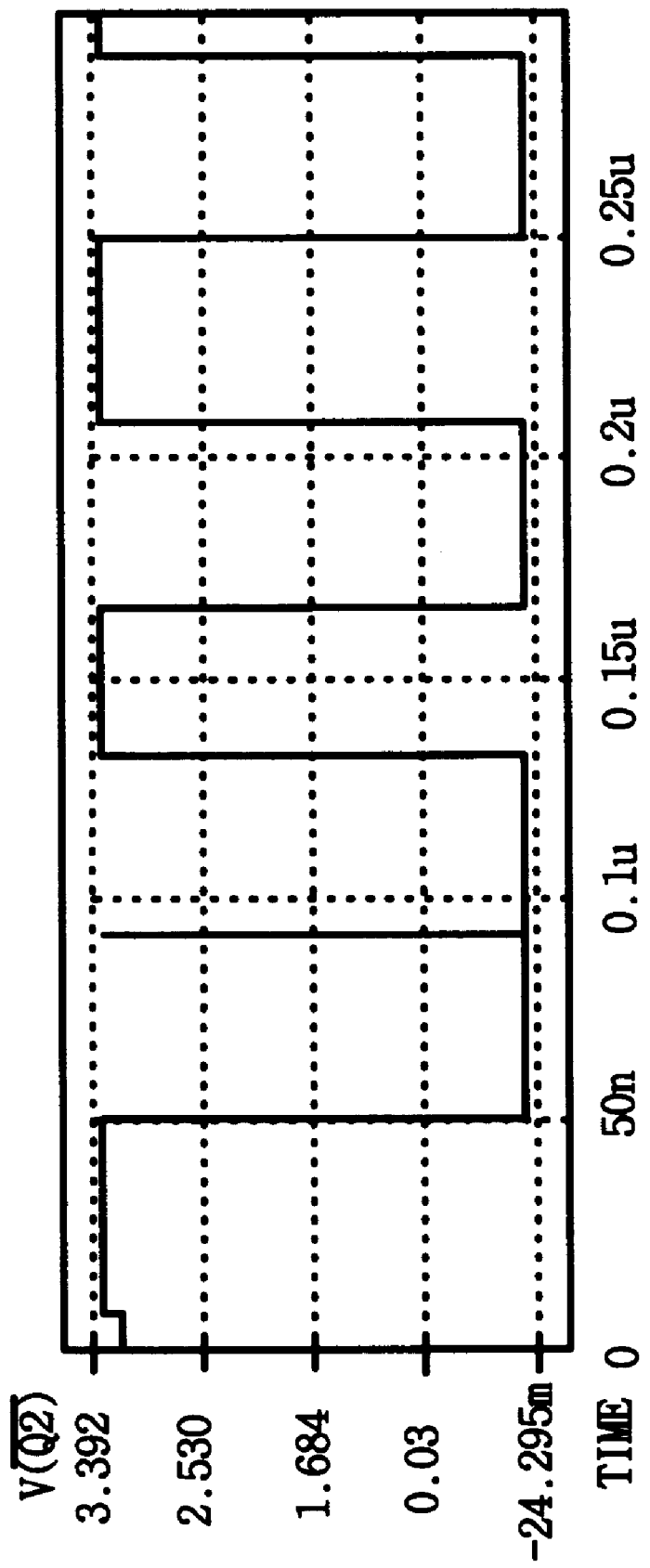

Simulation (i.e., HSPICE) results of the second preferred embodiment of the falling edge operated D flip-flop according to the present invention are shown in FIGS. 12A–12C. As shown in FIGS. 12A–12C, at the rising edge of the clock signal CLK, the logical value of the input signal is maintained. However, at the falling edge of the clock signal CLK, the logical value of the data signal D, which was already input, is produced.

As described above, the preferred embodiments of a D flip-flop according to the present invention have various advantages. The preferred embodiments of a D flip-flop use a reduced number of elements. A D flip-flop, which produces data at the rising edge of the clock signal, and a D flip-flop, which produces data at the falling edge of the clock signal, use ratioed latches and clock operated CMOS latches. The number of the elements required for such rising edge D flip-flops and falling edge D flip-flops is significantly reduced to reduce the interior capacitance. Further, the preferred embodiments of a D flip-flop have a reduced low power consumption and a high-speed operation.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. For example, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. A data storage device, comprising:
    a first latch that receives a clock signal and a data signal and produces a first output signal, wherein the first output signal is an inverted logical value of the data signal when the clock signal is low level, wherein the first latch consists of,
    a first pull-up element controlled by the clock signal, and
    a first pull-down element controlled by the data signal, wherein the first pull-down element is coupled at a first node in series with the first pull-up element between first and second prescribed voltages;
    a second latch that receives the first output signal and the clock signal and produces a second output signal, wherein the second output signal is high level when the clock signal is low level; and
    a third latch that receives the second output signal and the clock signal and produces a third output signal, wherein the third output signal is an inverted logical value of the second output signal when the clock signal is high level.

2. The data storage device of claim 1, wherein an initial value of the third output signal is a prescribed level.

3. The data storage device of claim 1, wherein the first output signal does not change when the data signal is low level while the clock signal is high level, wherein the first output signal has a low level when the data signal is high level while the clock signal is the high level, wherein the second output signal does not change when the first output signal is the low level when the clock signal is the high level, and wherein the second output signal has a low level when the first output signal is high level when the clock signal is the high level.

4. The data storage device of claim 1, wherein a value of the third output signal is maintained when the second output signal is high level while the clock signal is low level, and wherein the third output signal has a high level when the second output signal is low level while the clock signal is the low level.

5. The data storage device of claim 2, further comprising an inverter that inverts the third output signal, wherein the initial value of the third output signal is a high level.

6. The data storage device of claim 1, wherein the first node outputs the first output signal, and wherein a driving capability of the first pull-down element is higher than a driving capability of the first pull-up element.

7. The data storage device of claim 1, wherein the second latch consists of:
    a second pull-up element controlled by the clock signal; and
    a second pull-down element controlled by the first output signal, wherein the second pull-down element is coupled at a second node in series with the second pull-up element between the first and second prescribed voltages, wherein the second node outputs the second output signal, and wherein a driving capability of the second pull-up element is higher than a driving capability of the second pull-down element.

8. The data storage device of claim 1, wherein the third latch comprises:
    a third pull-up element controlled by the second output signal;
    a third pull-down element controlled by the clock signal; and
    a fourth pull-down element controlled by the second output signal, wherein the fourth pull-down element is coupled in series with the third pull-up element and the third pull-down element between first and second prescribed voltages, and wherein a third node couples the third pull-down and pull-up elements to output the third output signal.

9. The data storage device of claim 8, wherein the third pull-up element, the third pull-down element, and the fourth pull-down element are transistors.

10. The data storage device of claim 8, wherein the third and fourth pull-down elements are NMOS transistors, and wherein the third pull-up element is a PMOS transistor.

11. A data storage device, comprising:
    a first latch that receives a clock signal and a data signal and produces a first output signal, wherein the first output signal is an inverted logical value of the clock signal when the data signal is low level;
    a second latch that receives the first output signal and the clock signal and produces a second output signal, wherein the second output signal is an inverted level of the clock signal when the first output signal is low level, wherein the second latch consists of, a second pull-up element controlled by the first output signal, and a second pull-down element controlled by the clock signal, wherein the second pull-down element is coupled at a second node in series with the second pull-up element between first and second prescribed voltages; and a third latch that receives the second output signal and the clock signal and produces a third output signal, wherein the third output signal is a high level when the second output signal is low level.

12. The data storage device of claim 11, wherein a value of the first output signal is maintained when the clock signal is low level while the data signal is high level, and wherein the first output signal has a low level when the clock signal is high level when the data signal is the high level.

13. The data storage device of claim 11, wherein a value of the second output signal is maintained when the clock signal is low level while the first output signal is high level, and wherein the second output signal has a high level when the clock signal is high level when the first output signal is the high level.

14. The data storage device of claim 11, wherein a value of the third output signal is maintained when the clock signal is high level while the second output signal is low level, and wherein the third output signal has a high level when the clock signal is low level while the second output signal is the low level.

15. The data storage device of claim 11, wherein the second node outputs the second output signal, and wherein a driving capability of the second pull-down element is higher than a driving capability of the second pull-up element.

16. The data storage device of claim 15, wherein the first latch comprises:

a first pull-up element controlled by the data signal; and a first pull-down element controlled by the clock signal, wherein the first pull-up element is coupled at a first node in series with the first pull-down element between the first and second prescribed voltages, wherein the first node outputs the first output signal, and wherein a driving capability of the first pull-down element is higher than a driving capability of the first pull-up element.

17. The data storage device of claim 11, wherein the third latch comprises:

a third pull-up element controlled by the second output signal, a fourth pull-up element controlled by the clock signal; and a third pull-down element controlled by the second output signal, wherein the fourth pull-up element is coupled in series with the third pull-up element and the third pull-down element between first and second prescribed voltages, and wherein a third node couples the third pull-down and pull-up elements to produce the third output signal.

18. A data storage device, comprising:

a three stage unit, wherein each stage receives a clock signal, wherein a first stage receives a data signal, wherein a second stage receives a first output signal from the first stage, wherein a third stage receives a second output signal from the second stage, wherein the first and second stages are latches each comprising a pull-up transistor and a pull down transistor, wherein a driving capability of the pull-up transistor and a driving capability of the pull-down transistor are not equal in each of the first and second stages, and wherein the first latch consists of:

a first pull-up transistor controlled by one of the clock signal and the data signal; and a first pull-down transistor controlled by the other of the clock signal and the data signal, wherein the first pull-down transistor is coupled at a first node in series with the first pull-up transistor between first and second prescribed voltages, wherein the first node outputs the first output signal.

19. The data storage device of claim 18, wherein the third stage comprises:

a clocked latch comprising three elements coupled in series between first and second prescribed voltages and controlled by at least one of the clock signal and an output signal of the second stage, and wherein the three elements are at least one of pull-up and pull-down elements; and a logic gate that logically processes an output signal of the clocked latch to output the data signal.

20. The data storage device of claim 18, wherein the second latch consists of, a second pull-up transistor controlled by one of the clock signal and the first output signal, and a second pull-down transistor controlled by the other of the clock signal and the first output signal, wherein the second pull-down transistor is coupled at a second node in series with the second pull-up transistor between the first and second prescribed voltages, wherein the second node outputs the second output signal.

* * * * *